(12) United States Patent
Luo et al.

(10) Patent No.: US 9,543,188 B2
(45) Date of Patent: Jan. 10, 2017

(54) ISOLATION STRUCTURE, METHOD FOR MANUFACTURING THE SAME, AND SEMICONDUCTOR DEVICE HAVING THE STRUCTURE

(75) Inventors: Zhijiong Luo, Poughkeepsie, NY (US); Haizhou Yin, Poughkeepsie, NY (US); Huilong Zhu, Poughkeepsie, NY (US); Huicai Zhong, Beijing (CN)

(73) Assignee: INSTITUTE OF MICROELECTONICS, CHINESE ACADEMY OF SCIENCES, Beijing (CN)

( * ) Notice: Subject to any disclaimer, the term of this patent is extended or adjusted under 35 U.S.C. 154(b) by 502 days.

(21) Appl. No.: 13/142,378

(22) PCT Filed: Mar. 2, 2011

(86) PCT No.: PCT/CN2011/071459
§ 371 (c)(1),
(2), (4) Date: Jun. 27, 2011

(87) PCT Pub. No.: WO2012/062068
PCT Pub. Date: May 18, 2012

(65) Prior Publication Data
US 2012/0112288 A1    May 10, 2012

(30) Foreign Application Priority Data

Nov. 9, 2010    (CN) .......................... 2010 1 0540071

(51) Int. Cl.
*H01L 21/76*    (2006.01)
*H01L 21/762*   (2006.01)
*H01L 21/8234*  (2006.01)

(52) U.S. Cl.
CPC . *H01L 21/76232* (2013.01); *H01L 21/823481* (2013.01)

(58) Field of Classification Search
CPC .. H01L 21/76; H01L 21/762; H01L 21/76224; H01L 21/76816; H01L 21/76831; H01L 21/76832; H01L 27/10823; H01L 27/1087; H01L 27/10876
(Continued)

(56) References Cited

U.S. PATENT DOCUMENTS

2007/0099366 A1*  5/2007  Ahn et al. ............... 438/197
2010/0237432 A1*  9/2010  Takeoka et al. ......... 257/369

FOREIGN PATENT DOCUMENTS

CN    101667577         *  3/2010
KR    1020080001269 A      1/2008

OTHER PUBLICATIONS

PCT/CN2011/071459 Search Report.
(Continued)

*Primary Examiner* — Mohammad Choudhry
(74) *Attorney, Agent, or Firm* — Troutman Sanders LLP

(57) ABSTRACT

The present invention provides an isolation structure for a semiconductor substrate and a method for manufacturing the same, as well as a semiconductor device having the structure. The present invention relates to the field of semiconductor manufacture. The isolation structure comprises: a trench embedded in a semiconductor substrate; an oxide layer covering the bottom and sidewalls of the trench, and isolation material in the trench and on the oxide layer, wherein a portion of the oxide layer on an upper portion of the sidewalls of the trench comprises lanthanum-rich oxide. By the trench isolation structure according to the present invention, metal lanthanum in the lanthanum-rich oxide can diffuse into corners of the oxide layer of the gate stack, thus alleviating the impact of the narrow channel effect and making the threshold voltage adjustable.

8 Claims, 3 Drawing Sheets

(58) Field of Classification Search
USPC .......................................................... 257/374
See application file for complete search history.

(56) References Cited

OTHER PUBLICATIONS

PCT/CN2011/071459 Written Opinion.
M. Inoue, et al. Impact of Area Scaling on Threshold Voltage Lowering in La-Containing High-k/Metal Gate NMOSFETs Fabricated on (100) and (110) Si; 2009 Symposium on VLSI Technology Digest of Technical Papers; pp. 40-41.

* cited by examiner

ISOLATION STRUCTURE, METHOD FOR MANUFACTURING THE SAME, AND SEMICONDUCTOR DEVICE HAVING THE STRUCTURE

CROSS-REFERENCE TO RELATED APPLICATIONS

This application is a Section 371 National Stage Application of International Application No. PCT/CN2011/071459, filed on Mar. 2, 2011, which claims priority to CN 201010540071.2, filed on Nov. 9, 2010, the entire contents of which are incorporated herein by reference in their entirety.

FIELD OF THE INVENTION

The present invention relates to the field of semiconductor design and manufacture, and particularly relates to an isolation structure for a semiconductor device, a method for manufacturing the same, and a semiconductor device having the structure.

BACKGROUND OF THE INVENTION

With the development of semiconductor technology, the sizes of transistors continue to shrink, thereby causing the speed of devices and systems to increase. In a transistor with smaller sizes, the thickness of the gate dielectric layer such as a $SiO_2$ layer becomes thinner. However, when the thickness of the $SiO_2$ layer decreases to a certain degree, the $SiO_2$ layer will not be able to provide a good insulation function, and it is easy to cause a leakage current from the gate to active regions. This substantially degrades the performance of the device.

A gate stack structure of high-K material/metal has been proposed to replace the conventional gate stack structure of $SiO_2$/polysilicon. The high-K material is such a material, the dielectric constant K of which is larger than 3.9. For example, the high-K material may include $HfO_2$, HfSiO, HfSiON, HfTaO, HfTiO, HfZrO, $Al_2O_3$, or $La_2O_3$, etc. The above-mentioned leakage current problem can be overcome by a great degree with the use of the high-K material as the gate dielectric layer.

It is known that the threshold voltage ($V_t$) of a transistor can be effectively reduced by adding materials such as La into the material of the gate dielectric layer. This facilitates improving the performance of the device. However, the effectiveness of the materials such as La in reducing the threshold voltage $V_t$ is affected by many factors. For example, reference 1 (M. Inoue et al, "Impact of Area Scaling on Threshold Voltage Lowering in La-Containing High-k/Metal Gate NMOSFETs Fabricated on (100) and (110) Si", 2009 Symposium on VLSI Technology Digest of Technical Papers, pp. 40-41) discussed the effect of La in detail and found that there is a strong narrow channel effect, in which the effect of La becomes lower as the width of the gate becomes narrower, and a strong corner effect, in which the effect of La is affected by the round corners of the channel region.

As the channel becomes narrower, the effectiveness of the gate dielectric layer is affected across the channel region, and thus it is necessary to adopt other measures to efficiently deal with the reduction of the threshold voltage $V_t$.

SUMMARY OF THE INVENTION

An object of the present invention is to solve at least one of the above problems, in particular to solve the problem that the effectiveness of the gate dielectric layer is affected by the narrow channel effect, which causes the threshold voltage of the transistor to shift.

Therefore, one aspect of the present invention provides an isolation structure for a semiconductor device, comprising: a trench embedded in a semiconductor substrate; an oxide layer covering the bottom and sidewalls of the trench; and isolation material in the trench and on the oxide layer, wherein a portion of the oxide layer on an upper portion of the sidewalls of the trench comprises lanthanum-rich oxide.

Another aspect of the present invention provides a semiconductor device having the isolation structure, comprising: a semiconductor substrate; an isolation structure embedded in the semiconductor substrate, wherein the isolation structure comprises: a trench embedded in the semiconductor substrate; an oxide layer covering the bottom and sidewalls of the trench, and isolation material in the trench and on the oxide layer, wherein a portion of the oxide layer on an upper portion of the sidewalls of the trench comprises lanthanum-rich oxide; a gate region on the semiconductor substrate; and source/drain regions on opposite sides of the gate region and embedded in the semiconductor substrate.

A further aspect of the present invention provides a method for manufacturing an isolation structure for a semiconductor device, comprising: providing a semiconductor substrate; forming a trench in the semiconductor substrate; forming an oxide layer on the bottom and sidewalls of the trench, wherein a portion of the oxide layer on an upper portion of the sidewalls of the trench comprises lanthanum-rich oxide; and filling the trench with isolation material on the oxide layer.

In embodiments of the present invention, if the weight percentage of lanthanum element in the oxide is more than 5%, the oxide is called lanthanum-rich oxide.

According to the present invention, after a trench is formed in the semiconductor substrate, a lanthanum-rich region is formed on the upper portion of the sidewalls of the trench. After the oxide layer is formed, a portion of the oxide layer adjacent to the lanthanum-rich region forms lanthanum-rich oxide. The metal lanthanum in the lanthanum-rich oxide will diffuse into the gate dielectric layer, so that the impact of narrow channel effect can be alleviated. The impact of the round corners of the channel on the effectiveness of lanthanum can also be substantially alleviated. Meanwhile, the threshold voltage of the device can be adjusted. The embodiments of the present invention can reduce both process complexity and the amount of lanthanum needed.

EMBODIMENTS

The following disclosure provides many different embodiments or examples to implement different structures of the present invention. In order to simplify the disclosure of the present invention, the following description only describes components and arrangements of specific examples. It is apparent that they are only for exemplifying rather than limiting the present invention. Further, the present invention may iterate reference numbers and/or letters in different examples. Such iterations are for purpose of simplification and clarity rather than indicating relationships between various embodiments and/or arrangements discussed. In addition, the present invention provides examples of various specific processes and materials. However, those skilled in the art will appreciate the applications of other processes and/or other materials. In addition, the structure in which a first feature is described to be "on" a second feature may include an embodiment, in which the first and second features are formed in a direct contact, and also an embodiment, in which another structure is formed between the first and second features so that the first and second feature may not contact directly. It should be noted that the components shown in the figures are unnecessarily drawn to scale. Descriptions on well-known components, processing technologies and processes are omitted, in order not to improperly limit the present invention.

Figure 6:
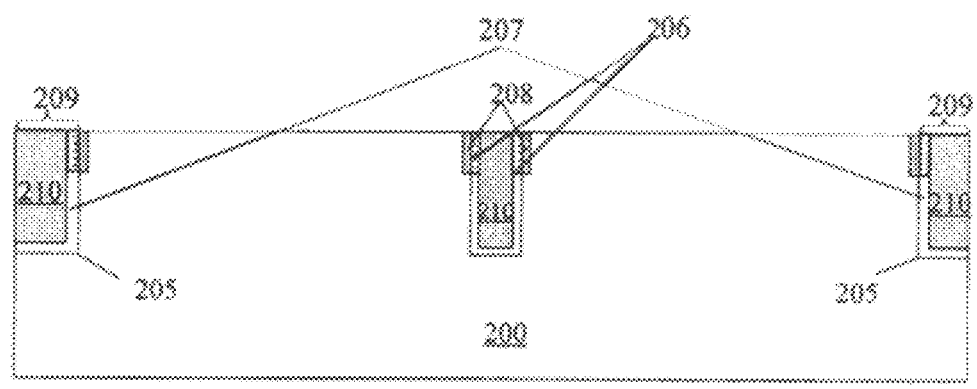

FIG. 6 shows an isolation structure 209 for a semiconductor device according to an embodiment of the present invention, comprising: a trench 205 embedded in a semiconductor substrate 200; an oxide layer 207 covering the bottom and sidewalls of the trench 205, and isolation material 210 in the trench and on the oxide layer 207, wherein a portion of the oxide layer 207 on an upper portion of the sidewalls of the trench 205 comprises lanthanum-rich oxide 206.

If the content of lanthanum element is more than 5%, the oxide is called lanthanum-rich oxide. In an embodiment of the present invention, the lanthanum-rich oxide 206 comprises any one of the following materials or a combination of more than one of the following materials: $La_2O_3$, LaAlO, LaHfO, and LaZrO.

The isolation material may include nitride or oxide, or a combination thereof.

The thickness of the oxide layer may be 1~20 nm.

A region of the semiconductor substrate adjacent to the portion of the oxide layer on the upper portion of the sidewalls of the trench 205 is a lanthanum-rich region 208.

Figure 7:
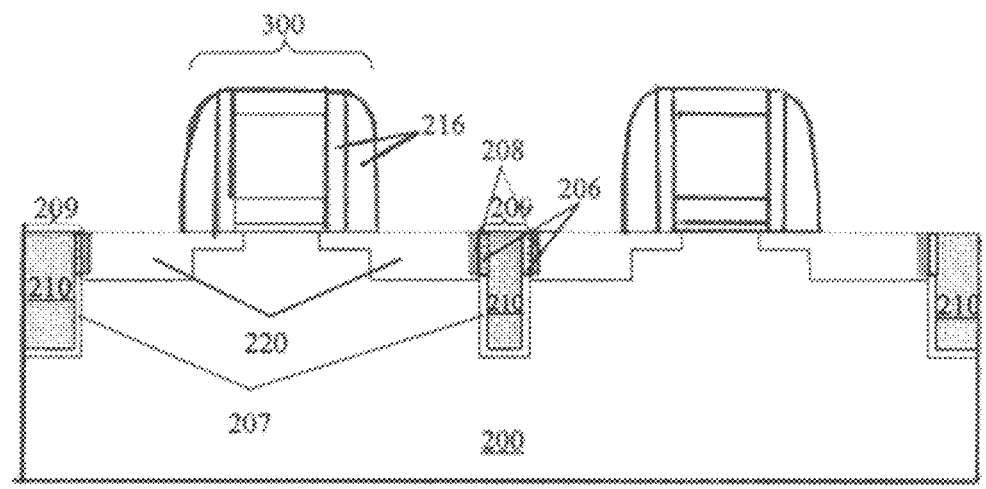

In addition, FIG. 7 shows a semiconductor device having the isolation structure 209. The device comprises: a semiconductor substrate 200; an isolation structure 209 formed in the semiconductor substrate 200; a gate stack 300 formed on the semiconductor substrate 200; and source/darin regions 220 formed on opposite sides of the gate stack 300.

The isolation structure 209 includes: a trench 205 embedded in the semiconductor substrate 200; an oxide layer 207 covering the bottom and sidewalls of the trench 205, and isolation material 210 in the trench and on the oxide layer 207, wherein a portion of the oxide layer 207 on an upper portion of the sidewalls of the trench 205 comprises lanthanum-rich oxide 206.

Optionally, the sidewalls of the gate stack 300 comprise spacers 216.

Preferably, the isolation material 210 may include nitride or oxide, or a combination thereof. The thickness of the oxide layer may be 1~20 nm. The content of lanthanum element in the lanthanum-rich oxide is more than 5%. A region of the semiconductor substrate adjacent to the portion of the oxide layer on the upper portion of the sidewalls of the trench is a lanthanum-rich region. The lanthanum-rich oxide comprises any one of the following materials or a combination of more than one of the following materials: $La_2O_3$, LaAlO, LaHfO, and LaZrO.

In an embodiment of the present invention, after the trench is formed in the semiconductor substrate, the lanthanum-rich region is formed on the upper portion of the sidewalls of the trench. After the oxide layer is formed, a portion of the oxide layer adjacent to the lanthanum-rich region forms lanthanum-rich oxide. The metal lanthanum in the lanthanum-rich oxide will diffuse into the gate dielectric layer, so that the impact of narrow channel effect will be alleviated. Meanwhile, the threshold voltage of the device can be adjusted. The embodiments of the present invention can reduce both process complexity and the amount of lanthanum needed.

Next, a method and processes for forming the isolation structure for the semiconductor device according to the present invention and the semiconductor device having the isolation structure will be described in detail. It should be noted that the following steps are only exemplary rather than limitations to the present invention. Those skilled in the art will appreciate that other processes are also possible.

Figure 1:
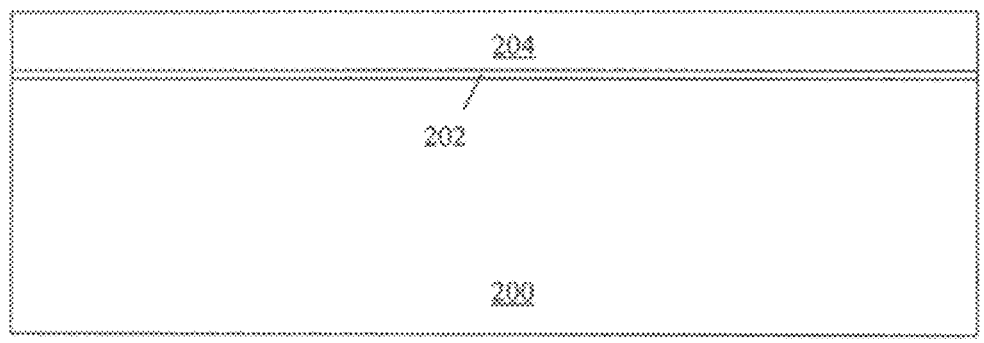
FIGS. 1-7 show sectional views of respective stages of manufacturing the isolation structure according to an embodiment of the present invention.

In step 1, as shown in FIG. 1, a semiconductor substrate 200 is provided. The substrate 200 comprises a semiconductor substrate (e.g. wafer) and may also comprise other semiconductors or compound semiconductors, e.g. Ge, GeSi, GaAs, InP, SIC, or diamond. According to the known design requirements in the prior art (e.g. for a p-type substrate or n-type substrate), the substrate 200 may comprise various doping configurations. Further, the substrate 200 may optionally comprise an epitaxial layer, which can be changed by stress to enhance its performance, and may comprise a Silicon-On-Insulator (SOI) structure. In this embodiment, the semiconductor substrate 200 is a Si substrate.

Figure 2:
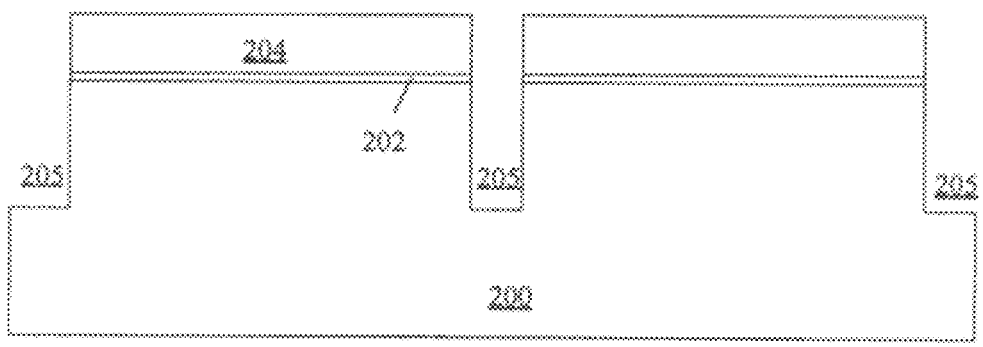

In step 2, a trench 205 is formed in the semiconductor substrate 200, as shown in FIG. 2. A concrete method for forming it is as follows. Firstly, at least one of an oxide pad 202 and a nitride pad 204 is formed on the semiconductor substrate 200, wherein the oxide pad 202 may be silicon oxide, etc. The nitride pad 204 may be silicon oxynitride, etc. The pads may be formed by thermal oxidation process or other deposition process, e.g. Chemical Vapour Deposition (CVD), Physical Vapour Deposition (PVD), Pulse Laser Deposition (PLD), Atom Layer Deposition (ALD), Plasma Enhanced Atom Layer Deposition (PEALD), or other methods. Next, a mask is formed on the nitride pad 204. Regions covered by the mask are active regions, and exposed regions are isolation regions. The nitride pad 204 and the oxide pad 202 are etched by etching techniques such as Reactive Ion Etching (RIE) until the regions on the semiconductor substrate 200 for pre-forming the isolation trenches are exposed. Then the mask on the nitride pad 204 is removed. Next, the semiconductor substrate 200 is etched by e.g. RIE to form the trenches 205.

Figure 3:
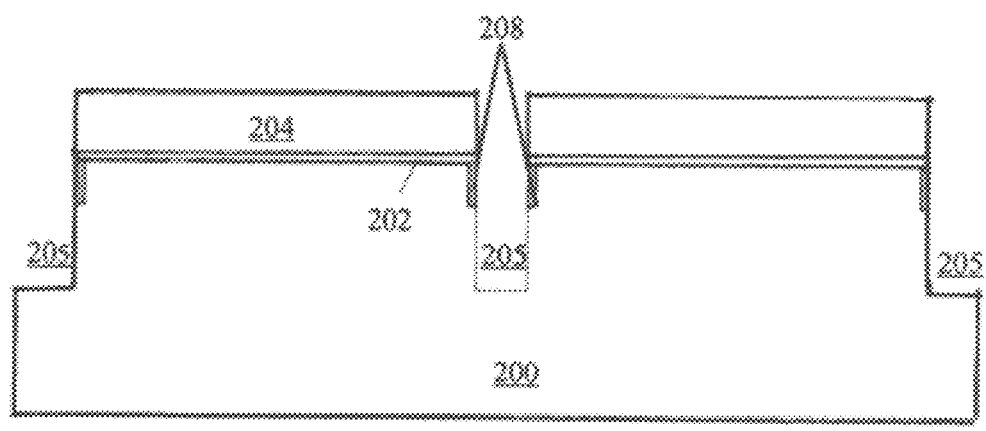
Figure 4:
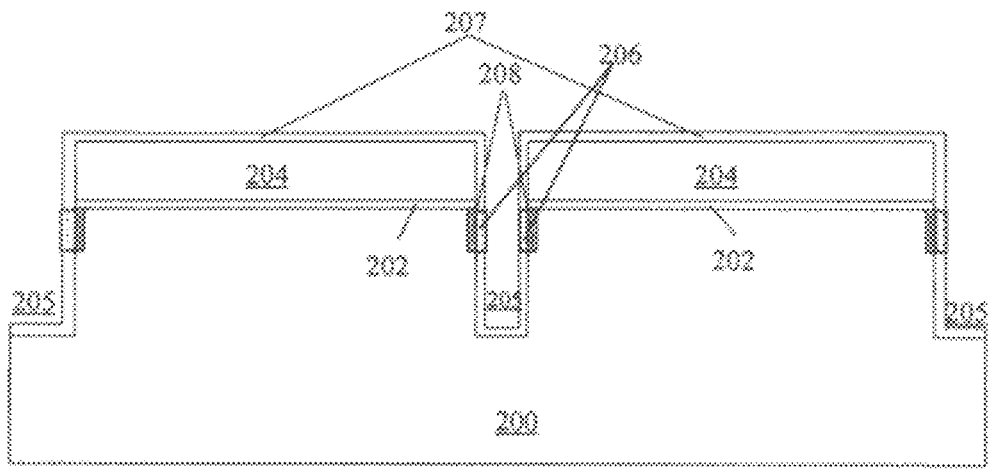

In step 3, as shown in FIG. 3, an oxide layer 207 is formed on the bottom and sidewalls of the trench 205, wherein a portion of the oxide layer on an upper portion of the sidewalls of the trench comprises lanthanum-rich oxide 206. This may be implemented by any one of the following two methods. In a first method, by utilizing the opening formed by the trench 205, metal lanthanum is deposited on the upper portions of the sidewalls of the trench 205 by tilt-angle evaporation, such that the regions of the semiconductor substrate adjacent to the portions of the oxide layer on the upper portions of the sidewalls of the trench 205 form lanthanum-rich regions 208. The angle for evaporating the metal lanthanum may be selected according to actual needs. Next, an oxide layer 207 is formed on the bottom and sidewalls of the trench 205. For example, the oxide layer 207 may be formed by annealing the substrate in an oxygen atmosphere. During the formation of the oxide layer 207, the metal lanthanum in the lanthanum-rich region 208 will be incorporated into the oxide layer 208 on the upper portions of the sidewalls of the trench 205 to form lanthanum-rich oxide 206. In a second method, metal lanthanum may be injected into the trench 205 by means of tilt-angle ion injection, such that regions of the semiconductor substrate adjacent to the oxide layer on the upper portions of the sidewalls or the trench 205 form lanthanum-rich regions 208. The angle for injecting the metal lanthanum may be selected according to actual needs. Next, an oxide layer 207 is formed on the bottom and sidewalls of the trench 205. For example, the oxide layer 207 may be formed by annealing the substrate in an oxygen atmosphere. During the formation of the oxide layer 207, the metal lanthanum in the lanthanum-rich region 208 will be incorporated into the oxide layer 208 on the upper portions of the sidewalls of the trench 205 to form lanthanum-rich oxide 206.

Since the lanthanum-rich region only needs to be formed on the upper portions of the sidewalls of the trenches, the complexity of processes and the amount of lanthanum needed are reduced, and thus the cost saved.

The above two methods are only examples, and the present invention is not limited thereto. The lanthanum-rich oxide 206 may comprise any one of the following materials or a combination of more than one of the following materials: $La_2O_3$, LaAlO, LaHfO, and LaZrO. In the lanthanum-rich oxide 206, the weight percentage of the lanthanum element is more than 5%. In the lanthanum-rich regions 208, the weight percentage of the lanthanum element is more than 5%.

Figure 5:
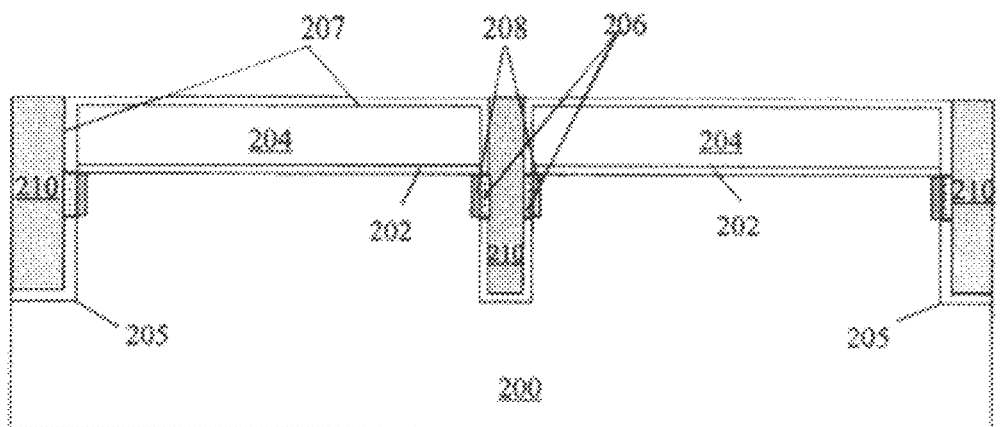

In step 4, an isolation structure 209 is formed by filling the trench 205 with isolation material 210, as shown in FIG. 5. In particular, firstly, isolation material is filled in the trench 205. The isolation material 210 may be nitride or oxide, or a combination thereof. The isolation material fills up the trench 205 until it covers the nitride pad 204. Then a planarization process, such as Chemical Mechanical Planarization (CMP), is performed, until the nitride pad 204 is exposed. Next, the planarization continues and removes the nitride pad 204, the oxide pad 202, and a part of the insulation material on the trench 205, until the semiconductor substrate 200 and the trench 205 are exposed. As shown in FIG. 6, an isolation structure 209 is accordingly formed by filling the trench 205 with the isolation material.

Then, a desired device structure may be further formed on the semiconductor substrate 200, which typically includes a gate stack 300 and its spacer 216, as well as a source region and a drain region 220 at opposite sides of the gate stack 300, as shown in FIG. 7. The spacer 216 may have a structure of one or more layers according to actual needs, which is not strictly specified here.

Figure 8:
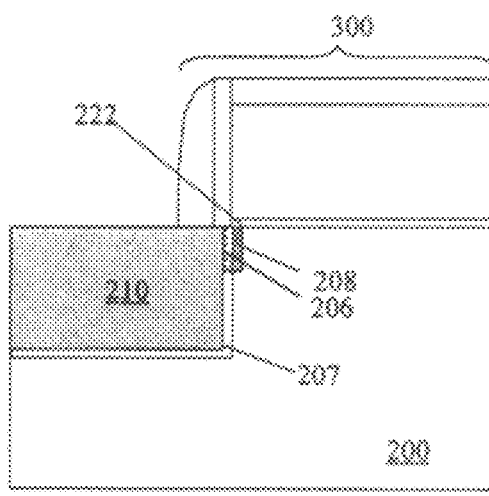
FIG. 8 shows a sectional view of a semiconductor device having the isolation structure according to an embodiment of the present invention.

FIG. 8 shows a sectional view of the structure of the device in a direction perpendicular to the direction of FIGS. 1-7, illustrating the diffusion of the lanthanum element into the gate dielectric layer. In the present invention, after a trench is formed in the semiconductor substrate, a lanthanum-rich region is formed on the upper portion of the sidewalls of the trench. After the oxide layer is formed in the trench, the lanthanum element in the lanthanum-rich region and the adjacent oxide layer combine to form the lanthanum-rich oxide. The metal lanthanum in the lanthanum-rich oxide will diffuse into the corner 222 of the gate dielectric layer, as shown in FIG. 8, so that the impact of narrow channel effect can be alleviated. The impact of the round corners of the channel can also be substantially alleviated. Meanwhile, the threshold voltage of the device can be adjusted. In addition, the trench having such a structure can have a better isolation effect. Thus, the leakage current can be further blocked to ensure the stability and performance of the device. The embodiments of the present invention can reduce process complexity and the amount of lanthanum needed. The embodiments of the present invention are applicable to the high-K/metal gate process of semiconductor devices.

The exemplary embodiments and advantages thereof have been explained in detail, however, the embodiments can be varied, replaced, and modified without departing from the spirit of the present invention and the protection scope defined by the attached claims. As for other examples, those skilled in the art will understand that the order of the steps of the process can change within the protection scope of the present invention.

Furthermore, the scope of the present invention is not limited to the processes, structures, manufacturing, compositions, means, methods, and steps of the specific embodiments as described in the specification. According to the disclosure of present invention, a person skilled in the art will easily appreciate that, when the processes, structures, manufacturing, compositions, means, methods, and steps currently existing or to be developed in future are adopted to perform functions substantially the same as corresponding embodiments described in the present invention, or achieve substantially the same effects, a person skilled in the art can make applications of them under the teaching of the present invention, without deviating from the scope of the present invention defined by the claims.

What is claimed is:

1. An isolation structure for a semiconductor device, comprising:
    a trench embedded in a semiconductor substrate;
    an oxide layer covering a bottom and sidewalls of the trench; and
    isolation material in the trench and on the oxide layer,
    wherein only a region of the semiconductor substrate that is adjacent to an upper-half portion of the oxide layer on the sidewalls of the trench is a lanthanum-rich region and only the upper-half portion of the oxide layer on the sidewalls of the trench adjacent to the lanthanum-rich region comprises lanthanum-rich oxide.

2. The isolation structure according to claim 1, wherein the isolation material comprises nitride or oxide, or a combination thereof.

3. The isolation structure according to claim 1, wherein the thickness of the oxide layer is 1-20 nm.

4. The isolation structure according to claim 1, wherein the content of lanthanum element in the lanthanum-rich oxide is more than 5%.

5. The isolation structure according to claim 1, wherein the lanthanum-rich oxide comprises any one of the following materials or a combination of more than one of the following materials: $La_2O_3$, LaAlO, LaHfO, and LaZrO.

6. A semiconductor device having the isolation structure according to claim 1, comprising:
    a semiconductor substrate, wherein the isolation structure is embedded in the semiconductor substrate;
    a gate region on the semiconductor substrate; and
    source/drain regions on opposite sides of the gate region and embedded in the semiconductor substrate.

7. The semiconductor device according to claim 6, wherein the content of lanthanum element in the lanthanum-rich oxide is more than 5%.

8. The semiconductor device according to claim 6, wherein the lanthanum-rich oxide comprises any one of the following materials or a combination of more than one of the following materials: $La_2O_3$, LaAlO, LaHfO, and LaZrO.

* * * * *

UNITED STATES PATENT AND TRADEMARK OFFICE
CERTIFICATE OF CORRECTION

| | | |
|---|---|---|
| PATENT NO. | : 9,543,188 B2 | Page 1 of 1 |
| APPLICATION NO. | : 13/142378 | |
| DATED | : January 10, 2017 | |
| INVENTOR(S) | : Zhijiong Luo et al. | |

It is certified that error appears in the above-identified patent and that said Letters Patent is hereby corrected as shown below:

On the Title Page

Item (73), replace "INSTITUTE OF MICROELECTONICS, CHINESE ACADEMY OF SCIENCES, Beijing (CN)" with "INSTITUTE OF MICROELECTRONICS, CHINESE ACADEMY OF SCIENCES, Beijing (CN)".

Signed and Sealed this
Twenty-eighth Day of March, 2017

Michelle K. Lee
*Director of the United States Patent and Trademark Office*